United States Patent
Liu

(10) Patent No.: US 11,984,369 B2
(45) Date of Patent: May 14, 2024

(54) SEMICONDUCTOR STRUCTURE

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 421 days.

(21) Appl. No.: 17/373,948

(22) Filed: Jul. 13, 2021

(65) Prior Publication Data

US 2021/0343607 A1 Nov. 4, 2021

Related U.S. Application Data

(63) Continuation of application No. PCT/CN2021/081701, filed on Mar. 19, 2021.

(30) Foreign Application Priority Data

Apr. 3, 2020 (CN) .......................... 202010260440.6

(51) Int. Cl.
*H01L 21/66* (2006.01)
*H01L 27/092* (2006.01)

(52) U.S. Cl.
CPC ............ *H01L 22/32* (2013.01); *H01L 27/092* (2013.01)

(58) Field of Classification Search
CPC ....... H01L 22/32; H01L 27/092; H01L 22/34; H01L 23/544
See application file for complete search history.

(56) References Cited

U.S. PATENT DOCUMENTS

| 5,315,145 | A | 5/1994 | Lukaszek |
| 5,594,328 | A | 1/1997 | Lukaszek |
| 5,781,445 | A | 7/1998 | Shiue |
| 5,869,877 | A * | 2/1999 | Patrick .................... H01L 22/34 |
| | | | 438/18 |
| 6,051,443 | A | 4/2000 | Ghio |
| 6,372,525 | B1 | 4/2002 | Lin |
| 6,586,765 | B2 | 7/2003 | Lin |
| 7,646,643 | B1 | 1/2010 | Lin |
| 2002/0098604 | A1 | 7/2002 | Lin |
| 2007/0228479 | A1* | 10/2007 | Hook ................... H01L 27/1203 |
| | | | 257/369 |

FOREIGN PATENT DOCUMENTS

| CN | 103094253 A | 5/2013 |
| CN | 204155929 U | 2/2015 |
| EP | 0678909 A1 | 10/1995 |

OTHER PUBLICATIONS

International Search Report in the international application No. PCT/CN2021/081701, mailed on May 19, 2021, 3 pgs.

* cited by examiner

*Primary Examiner* — Thanh T Nguyen
(74) *Attorney, Agent, or Firm* — Cooper Legal Group, LLC

(57) ABSTRACT

A semiconductor structure includes: a substrate; an insulating region located in the substrate; a first conductor located above the insulating region and configured to collect charges; a second conductor at least partially located above the insulating region and configured to induce the charges of the first conductor; and a dielectric layer located between the first conductor and the second conductor to electrically insulate the first conductor from the second conductor.

10 Claims, 3 Drawing Sheets

SEMICONDUCTOR STRUCTURE

CROSS-REFERENCE TO RELATED APPLICATION

This is a continuation application of International Patent Application No. PCT/CN2021/081701, filed on Mar. 19, 2021, which claims priority to Chinese patent application No. 202010260440.6, filed on Apr. 3, 2020 and entitled "SEMICONDUCTOR STRUCTURE". The disclosures of International Patent Application No. PCT/CN2021/081701 and Chinese patent application No. 202010260440.6 are incorporated by reference herein in their entireties.

TECHNICAL FIELD

The disclosure relates to the technical field of a semiconductor, and particularly to a semiconductor structure.

BACKGROUND

In a deep submicron integrated circuit process, High Density Plasma Enhanced Deposition (HDPECVD) and plasma etching technologies are generally used frequently. However, in a high density plasma enhanced deposition or plasma etching procedure, free charges are generated, and when a conductor (metal or polysilicon) is etched, an exposed conductor surface may collect the free charges. If the conductor on which the charges are accumulated is directly connected to a gate of a device, a gate leakage current may be formed in a thin oxide layer under a polysilicon gate. When the accumulated charges exceed a certain number, the gate oxide layer may be damaged and cause circuit failures, which will result in that the reliability and the service life of the device and even a whole chip are seriously reduced. Generally, this situation is referred to as Plasma Induced Damage (PID), and is also referred to as Process Antenna Effect (PAE).

In the related technologies, the process antenna effect may be monitored. However, a monitoring structure in the related technologies is difficult to accurately evaluate the extent to which the gate oxide layer is affected by the process antenna effect after each metal layer is made.

SUMMARY

According to various embodiments, a semiconductor structure is provided, which may effectively monitor the influence of process antenna effect on a gate oxide layer.

The semiconductor structure, includes: a substrate, an insulating region, a first conductor, a second conductor and a dielectric layer.

The insulating region is located in the substrate.

The first conductor is located above the insulating region and configured to collect charges.

The second conductor is at least partially located above the insulating region and configured to induce the charges of the first conductor.

The dielectric layer is located between the first conductor and the second conductor and configured to electrically insulate the first conductor from the second conductor.

When the above semiconductor structure performs measurement on the process antenna effect, the first conductor collects the charges and the second conductor induces the charges in a manner of forming a capacitance between the second conductor and the first conductor. In this way, when the area of a certain metal layer in the first conductor is larger and a measuring structure is broken down during a measurement of the certain metal layer, the situation that the charges on the metal layer behind the certain metal layer cannot be measured may be avoided, and the measurement accuracy is improved.

BRIEF DESCRIPTION OF THE DRAWINGS

For a better description and illustration of embodiments of the present application, reference may be made to one or more of the accompanying drawings, but additional details or examples used to describe the drawings should not be construed as limiting the scope of any one of inventions and innovations, currently described embodiments, or preferred modes of the present application.

DETAILED DESCRIPTION

Figure 1:
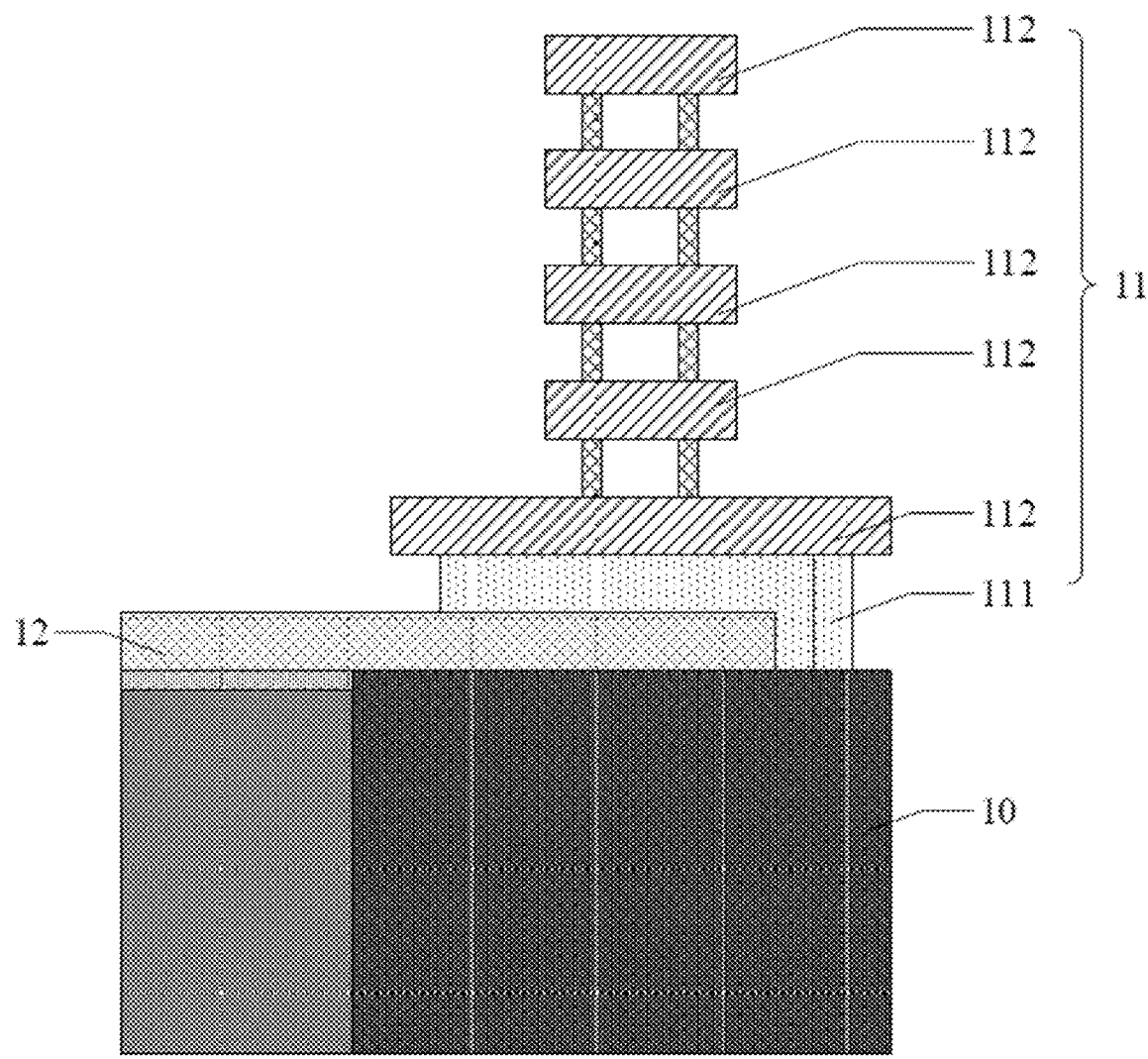
FIG. 1 is a schematic cross-sectional view of a semiconductor structure shown in one embodiment.

To facilitate understanding of the disclosure, the disclosure will be described below in detail with reference to the accompanying drawings. Preferred embodiments of the disclosure are illustrated in the accompanying drawings. However, the disclosure may be embodied in many different forms and should not be construed as limited to the embodiments set forth herein. Rather, these embodiments are provided so that the disclosure will be thorough and complete.

Unless otherwise defined, all technical and scientific terms used herein have the same meaning as commonly understood by those of ordinary skill in the art to which the disclosure belongs. The terms used herein in the specification of the disclosure are for the purpose of describing specific embodiments only and are not intended to be limiting of the disclosure. As used herein, the term "and/or" includes any and all combinations of one or more of the associated listed items.

In the description of the disclosure, it is to be understood that the terms "upper", "lower", "vertical", "horizontal", "inner", "outer", and the like refer to orientations or location relationships based on methods or location relationships shown in the drawings, are merely intended to facilitate the description of the disclosure and to simplify the description, and are not intended to indicate or imply that a device or element referred to must have a specific orientation or be configured and operated in a specific orientation, so that the terms are not to be construed as limiting the disclosure.

As shown in FIG. 1, according to an embodiment, a semiconductor structure is provided, including: a substrate; an insulating region 10, a first conductor 11, a second conductor 12 and a dielectric layer (not shown in the figure). The insulating region 10 is located in the substrate. The first conductor 11 is located above the insulating region 10 and configured to collect charges. The second conductor 12 is at least partially located above the insulating region 10 and configured to induce the charges of the first conductor 11. The dielectric layer is located between the first conductor 11 and the second conductor 12, to electrically insulate the first conductor 11 from the second conductor 12.

When the above semiconductor structure performs measurement on the process antenna effect, the first conductor 11 collects the charges and the second conductor 12 induces the charges in a manner of forming a capacitance between the second conductor 12 and the first conductor 11. In this way, when the area of a certain metal layer in the first conductor 11 is larger and a measuring structure is broken down during a measurement of the certain metal layer, the situation that the charges on metal layer behind the certain metal layer cannot be measured may be avoided, and the measurement accuracy is improved.

In an alternative embodiment, the substrate may be a semiconductor substrate, such as a monocrystalline silicon substrate, a monocrystalline germanium substrate, or the like.

In an alternative embodiment, material of the dielectric layer includes one or more of silicon dioxide or silicon nitride.

In an alternative embodiment, the insulating region 10 includes a shallow trench isolating structure. The shallow trench isolating structure may be formed by forming a shallow trench in the substrate and filling the shallow trench with an insulating layer. The filled insulating layer may be an oxide or nitride, such as silicon dioxide or silicon nitride. In particular, a procedure of forming the shallow trench isolating structure may include: firstly, a photoresist layer is formed on an upper surface of the substrate, and a photo-etching is performed on the photoresist layer to pattern the photoresist layer, an opening pattern is formed in the patterned photoresist layer, and the substrate is exposed through the opening pattern, and the opening pattern defines a location and a shape of the shallow trench; secondly, an exposed substrate part is etched based on the patterned photoresist layer to form the shallow trench, and in particular, the substrate is etched by a dry etching process or a wet etching process; then, the insulating layer is deposited in the shallow trench, the shallow trench fills up with the insulating layer covering an upper surface of the substrate; and finally, the insulating layer covering the upper surface of the substrate is removed to obtain the shallow trench isolating structure.

In the above semiconductor structure, the first conductor 11 configured to collect the charges is located above the insulating region 10. The first conductor 11 does not occupy a location of an active region in the semiconductor structure, so that the effective area in the semiconductor device may be saved, and the size of the semiconductor structure may be made smaller.

In an alternative embodiment, the first conductor 11 may include a contact hole 111. The contact hole 111 may include one planar face which forms a capacitance with the second conductor 12. A gap exists between the contact hole 111 and the second conductor 12. The dielectric layer is located in the gap between the contact hole 111 and the second conductor 12.

Figure 3:
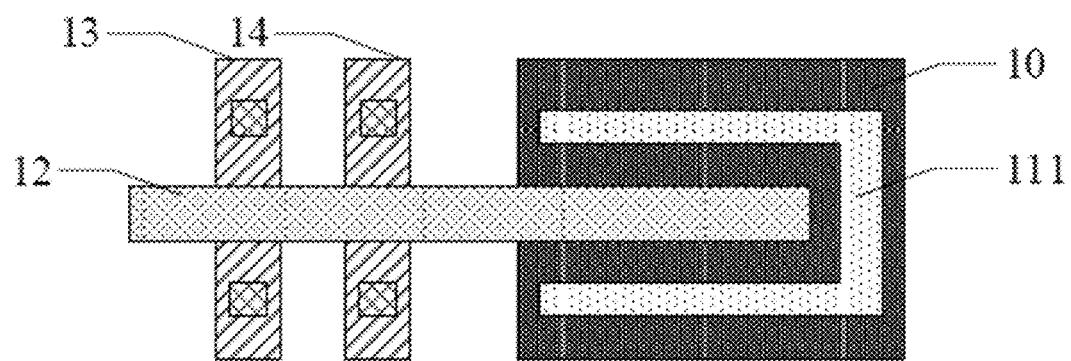
FIG. 3 is a schematic top view of a semiconductor structure shown in the embodiment shown in FIG. 2.

In another alternative embodiment, the first conductor 11 includes a contact hole 111. The contact hole 111 may include at least two planar faces which form a capacitance with the second conductor 12. The second conductor 12 is at least partially located in an opening of the contact hole 111, that is, the second conductor 12 is at least partially inserted into the contact hole 111. A gap exists between the second conductor 12 and the contact hole 111, and the dielectric layer is located in the gap between the contact hole 111 and the second conductor 12. The contact hole 111 may be any shape having an opening at a side facing the second conductor 12. In particular, a projection of the contact hole 111 on the insulating region 10 may include a U-shape, a V-shape or a C-shape, that is, the contact hole 111 may be a U-shaped structure, a V-shaped structure or a C-shaped structure, or the like. By arranging the contact hole 111 in such a way that only the side of the contact hole facing the second conductor 12 has the opening, the area of the contact hole 111 may be maximized. The larger the area of the contact hole 111 is, the larger the formed capacitance is, and the more obvious the charge induction effect is, thus facilitating the collection of the charges by the second conductor. As shown in FIG. 3, the projection of the contact hole 111 on the insulating region 10 may be U-shaped. The second conductor 12 is inserted into the contact hole 111, and sidewalls of the contact hole 111 on both sides of the second conductor 12 are parallel to the second conductor 12 to form a capacitance.

In an alternative embodiment, the first conductor 11 further includes at least one metal layer 112. In an embodiment, as shown in FIG. 1, the first conductor 11 includes five metal layers 112. It should be noted that, no particular limitations are here imposed on the number of the metal layers 112. The multiple metal layers 112 are sequentially stacked at intervals in a vertical direction. Adjacent metal layers 112 are electrically connected to one another by a conductive plug, so that the metal layers 112 are sequentially electrically connected. The metal layer 112 adjacent to the contact hole 111 is electrically connected to the contact hole 111, and therefore, the charges on each metal layer 112 may be induced by the second conductor 12 through the contact hole 111.

In an alternative embodiment, material of the metal layer 112 may include at least one of copper, aluminum, nickel or gold. Material of the conductive plug may include at least one of copper, aluminum, nickel or gold.

In an alternative embodiment, the contact hole 111 is actually a conductive contact structure filled in an interconnection contact hole between the metal layer 112 and the insulating region 10. The contact hole 111 may be any conductive contact structure. In particular, in the embodiment, the contact hole 111 may be a metal contact structure. Material of the contact hole 111 may be the same as material of the metal layer 112 and may also be the same as material of the conductive plug.

In an embodiment, when the first conductor 11 includes a plurality of metal layers 112, the area of each metal layer 112 may be different, for example, the area of a certain metal layer 112 may be greater than that of the other metal layers 112. In the example in FIG. 1, the area of the lowermost metal layer 112 is greater than that of the other metal layer 112, and in this case, the lowermost metal layer 112 with the largest area is directly electrically connected to the contact hole 111. It should be noted that, in other examples, the metal layer 112 at any other level may be greater than that of the other metal layers 112.

In an alternative embodiment, the second conductor 12 may be polysilicon or metal, and in the present embodiment, the second conductor 12 is the polysilicon. In particular, the second conductor 12 in the embodiment may be doped polysilicon.

Figure 2:
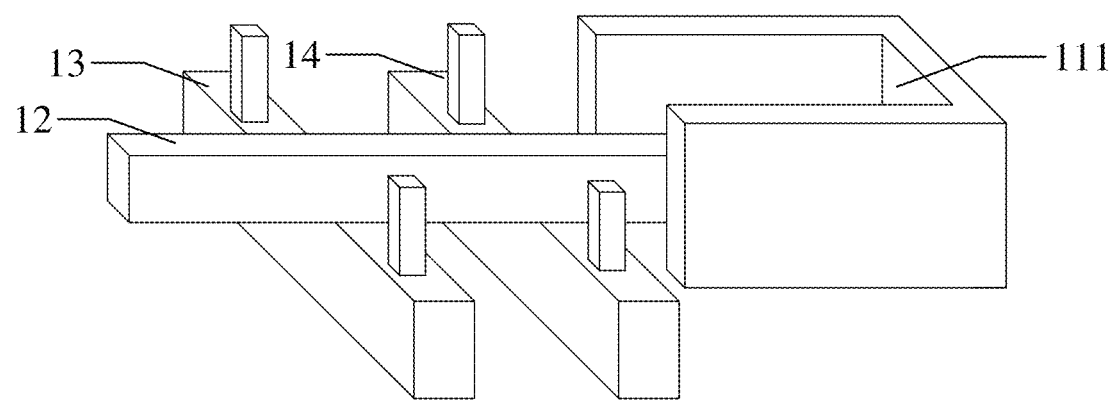
FIG. 2 is a perspective view of a semiconductor structure of another embodiment.

As shown in FIG. 2 and FIG. 3, in an alternative embodiment, the semiconductor structure further includes a first transistor 13 and a second transistor 14. Both the first transistor 13 and the second transistor 14 may be located on a side of the contact hole 111 towards which the opening is oriented. The first transistor 13 and the second transistor 14 are spaced apart from each other. Both a gate of the first transistor 13 and a gate of the second transistor 14 are electrically connected to the second conductor 12. In particular, the gate of the first transistor 13 and the gate of the second transistor 14 may be integrated with the second conductor 12, that is, the gate of the first transistor 13, the gate of the second transistor 14, and the second conductor 12 may be the same polysilicon layer formed by the same process. In this case, a source and a drain of the first transistor 13 are respectively located on two opposite sides of an extension direction of the second conductor 12. A source and a drain of the second transistor 14 are also respectively located on the two opposite sides of the extension direction of the second conductor 12. Therefore, after inducing the charges on the first conductor 11, the second conductor 12 transmits the charges to the gates of the first transistor 13 and the second transistor 14. The charges on the first conductor 11 can be detected through the first transistor 13 and the second transistor 14.

In an alternative embodiment, the first transistor 13 is an N-Metal-Oxide-Semiconductor (NMOS) transistor and the second transistor 14 is a Positive Channel Metal Oxide Semiconductor (PMOS) transistor. Optionally, the first transistor 13 may be the PMOS transistor and the second transistor 14 may be the NMOS transistor. Ions induced and collected by the second conductor 12 include positive ions and negative ions, the NMOS transistor may measure the positive ion, and the PMOS transistor may measure the negative ion. By arranging both of the PMOS transistor and the NMOS transistor, the positive ions and the negative ions induced and received by the second conductor 12 may be detected, so that the process antenna effect measurement accuracy of the semiconductor structure is improved. For example, a threshold voltage of the first transistor 13 may be designed to be 0.5 V, a threshold voltage of the second transistor 14 may be designed to be 0.7 V, a fixed voltage of 1 V may be connected to the drain of the first transistor 13, a fixed voltage of 0 V may be connected to the drain of the second transistor 14, and then currents flowing through the first transistor 13 and the second transistor 14 are monitored respectively at the same time. According to the magnitude of the current flowing through the first transistor 13, it can be determined whether the magnitude of the positive ions induced by the second conductor 12 exceeds the threshold voltage of 0.5V. According to the magnitude of the current flowing through the second transistor 14, it can be determined whether the magnitude of the negative ions induced by the second conductor 12 exceeds the threshold voltage of 0.7V. When the magnitude of the induced positive ions exceeds the threshold voltage of 0.5V or when the magnitude of the induced negative ions exceeds the threshold voltage of 0.7V, a value of the induced positive ion or negative ion may be accurately calculated, and further, the magnitude of the process antenna effect on the contact hole 111 can be evaluated.

When process antenna effect measurement is performed through the semiconductor structure in the above embodiments, the charges are collected, in particular, the charges are collected onto the contact hole 111 but are not directly connected to the gates of the first transistor 13 and the second transistor 14. The charges are induced by the second conductor 12 in a manner of forming a capacitance between the second conductor 12 and the contact hole 111, and then the induced charges are transmitted to the first transistor 13 and the second transistor 14 through the second conductor 12. In this way, when the area of a certain metal layer 112 in the first conductor 11 is larger and a measuring structure is broken down during a measurement of the certain metal layer, the situation that the charges on metal layer 112 behind the certain metal layer cannot be measured may be avoided, and the measurement accuracy is improved. In addition, due to the both of the PMOS transistor and the NMOS transistor are provided, both the positive ions and the negative ions can be detected, detection errors are reduced, and the measurement accuracy is improved.

The various technical features of the above embodiments may be combined in any combination, and in order to simplify the description, all possible combinations of the various technical features of the above embodiments are not described, however, as long as the combinations of these technical features are not contradictory, they should be considered to be within the scope of the specification.

The above embodiments merely illustrate several embodiments of the disclosure, which are described in more detail and are not to be construed as limiting the scope of the patent of the disclosure. It is to be noted that several variations and modifications may be made by those skilled in the art without departing from the spirit of the disclosure, which all fall within the scope of protection of the disclosure. Therefore, the scope of protection of the patent of the disclosure shall be determined by the appended claims.

The invention claimed is:

1. A semiconductor structure, comprising:
   a substrate;
   an insulating region, located in the substrate;
   a first conductor, located above the insulating region and configured to collect charges;
   a second conductor, at least partially located above the insulating region and configured to induce the charges of the first conductor; and
   a dielectric layer, located between the first conductor and the second conductor and configured to electrically insulate the first conductor from the second conductor,
   wherein the insulating region comprises a shallow trench insulating structure.

2. The semiconductor structure of claim 1, wherein the first conductor has a contact hole.

3. The semiconductor structure of claim 2, wherein a projection of the contact hole on the insulating region is U-shaped, V-shaped or C-shaped.

4. The semiconductor structure of claim 3, wherein the second conductor is at least partially located in an opening of the contact hole.

5. The semiconductor structure of claim 2, wherein the first conductor further comprises a metal layer, the metal layer being electrically connected with the contact hole.

6. The semiconductor structure of claim 1, wherein the second conductor comprises polysilicon.

7. The semiconductor structure of claim 1, further comprising:
   a first transistor and a second transistor, a gate of each of the first transistor and the second transistor being electrically connected with the second conductor.

8. The semiconductor structure of claim 7, wherein the first transistor is an N-Metal-Oxide-Semiconductor (NMOS) transistor, and the second transistor is a Positive Channel Metal Oxide Semiconductor (PMOS) transistor.

9. The semiconductor structure of claim 1, wherein a material of the dielectric layer is selected from at least one of silicon dioxide or silicon nitride.

10. A semiconductor structure, comprising:
    a substrate;
    an insulating region, located in the substrate;
    a first conductor, located above the insulating region and configured to collect charges;
    a second conductor, at least partially located above the insulating region and configured to induce the charges of the first conductor; and a dielectric layer, located between the first conductor and the second conductor and configured to electrically insulate the first conductor from the second conductor,
wherein the first conductor has a contact hole, a projection of the contact hole on the insulating region being U-shaped, V-shaped or C-shaped, and the second conductor being at least partially located in an opening of the contact hole.

* * * * *